United States Patent [19]

Aoshima et al.

[11] Patent Number: 5,741,619
[45] Date of Patent: Apr. 21, 1998

[54] NEGATIVE IMAGE-RECORDING MATERIAL COMPRISING AN ACRYLIC RESIN, A DIAZO COMPOUND AND CARBON BLACK

[75] Inventors: Keitaro Aoshima; Katsuji Kitatani; Hiroaki Yokoya; Yuichi Shiraishi, all of Shizuoka, Japan

[73] Assignee: Fuji Photo Film Co., Ltd., Kanagawa, Japan

[21] Appl. No.: 789,817

[22] Filed: Jan. 27, 1997

Related U.S. Application Data

[63] Continuation of Ser. No. 403,484, Mar. 14, 1995, abandoned.

[30] Foreign Application Priority Data

Mar. 15, 1994 [JP] Japan ................................ 6-44152
Apr. 15, 1994 [JP] Japan ................................ 6-77542

[51] Int. Cl.$^6$ ........................... G03F 7/021; G03F 7/30
[52] U.S. Cl. ........................... 430/175; 430/176; 430/302; 430/325; 430/944; 430/945
[58] Field of Search ........................ 430/175, 176, 430/944, 302, 325, 945

[56] References Cited

U.S. PATENT DOCUMENTS

| | | | |
|---|---|---|---|
| 4,123,276 | 10/1978 | Kita et al. | 96/91 |
| 4,248,959 | 2/1981 | Jeffers et al. | 430/300 |
| 4,334,006 | 6/1982 | Kitajima et al. | 430/175 |
| 5,089,372 | 2/1992 | Kirihata et al. | 430/175 |
| 5,153,095 | 10/1992 | Kawamura et al. | 430/175 |
| 5,372,915 | 12/1994 | Haley et al. | 430/176 |
| 5,478,690 | 12/1995 | Kanda et al. | 430/175 |

*Primary Examiner*—John S. Chu
*Attorney, Agent, or Firm*—Sughrue, Mion, Zinn, Macpeak & Seas, PLLC

[57] ABSTRACT

A negative-working image-recording material containing both a substance which absorbs light and generates heat and a diazonium compound having two or more diazohio groups in the molecule and a negative-working lithographic plate for direct platemaking by heat mode writing, the lithographic plate comprising a support having provided on at least one surface a substance which absorbs infrared or near infrared light and generates heat and a diazonium compound having two or more diazonio groups in the molecule.

7 Claims, No Drawings

NEGATIVE IMAGE-RECORDING MATERIAL COMPRISING AN ACRYLIC RESIN, A DIAZO COMPOUND AND CARBON BLACK

This is a Continuation of application Ser. No. 08/403,484 filed Mar. 14, 1995 (abandoned).

FIELD OF THE INVENTION

The present invention relates to an image-recording material which can be used as an offset printing master. More particularly, this invention relates to a lithographic plate for so-called direct platemaking in which an image can be directly formed from digital signals sent from a computer, etc.

BACKGROUND OF THE INVENTION

Conventional systems proposed for direct platemaking from digital data sent from a computer include (i) a system based on electrophotography, (ii) a system based on photopolymerization by a combination of exposure with an Ar laser and post-heating, (iii) a system employing a layer of a silver salt sensitive material formed on a photosensitive resin, (iv) a system of the silver master type, and (v) a system based on the destruction of a silicone rubber layer by means of electrical discharge or laser light.

System (i), which is based on electrophotography, involves troublesome processing steps such as charging, exposure, and development and needs a complicated large-scale apparatus. System (ii) not only necessitates a post-heating step but also needs a highly sensitive plate, which is difficult to handle in roomlight. Systems (iii) and (iv) have drawbacks that due to the use of a silver salt, the processing is troublesome and the system is costly. System (v) is a less defective technique, but still has a drawback that removal of a silicone residue from the plate surface is necessary.

Photosensitive image-recording materials containing a diazonium compound have conventionally been widely known, and such materials are used as lithographic plates. For example, negative type photosensitive image-recording materials comprising an appropriate binder and a diazo resin which is a condensate of a diazonium compound are described in JP-B-52-7364, JP-B-55-34929, and JP-B-57-43890. (The term "JP-B" as used herein means an "examined Japanese patent publication.") These image-recording materials each utilizes the decomposition of a diazonium compound upon light absorption. It is a matter of course that the light sources usable for the exposure of these image-recording materials are limited to those which emit light having a wavelength of 450 nm or shorter, since most of the practically useful diazonium compounds absorb light having a wavelength of 450 nm or shorter.

To enable image recording to be performed with light having a longer wavelength, use of a photosensitizer in combination with a diazonium compound is proposed in JP-A-52-151024 and U.S. Pat. No. 4,248,959. (The term "JP-A" as used herein means an "unexamined published Japanese patent application.") However, even with a photosensitizer, it is necessary to use light having a wavelength of 550 nm or shorter, so that an Ar laser is used as a light source for exposure.

On the other hand, as a result of remarkable developments in lasers in recent years, high-output small-sized products of solid-state or semiconductor lasers which emit light having a wavelength in the near infrared to the infrared region have become easily available. These lasers are extremely useful as a light source for exposure in direct platemaking from digital data sent from a computer, etc. However, these lasers are not applicable to image recording on the aforementioned photosensitive image-recording materials containing a diazonium compound, because most of the practically useful diazonium compounds have an absorption wavelength of 450 nm or shorter. Hence, an image-recording material on which recording is possible regardless of the wavelength of exposure light is desired.

JP-A-52-113219 discloses an image-recording material on which recording is possible regardless of the wavelength of exposure light, which recording material is a positive type image-recording material comprising a compound that decomposes upon exposure to light and heat (e.g., a diazonium compound), a particulate substance capable of absorbing light and converting the absorbed light into heat, and a binder. On this prior art recording material, an image is recorded based on the thermal decomposition of the diazonium compound. In JP-A-58-148792 is disclosed a positive type photo- and heat-sensitive recording material containing a particulate thermoplastic resin, a light-heat converter substance, and a photocrosslinking substance (e.g., a diazonium compound) as major components. In this photo- and heat-sensitive recording material, particles of the thermoplastic resin form an image upon heating and the durability of the image is improved by the direct decomposition of the photocrosslinking substance upon exposure to light.

In direct platemaking, in which a laser light beam is scanned to write an image, use of negative type recording materials is preferred in that writing on negative type materials can be completed in a shorter time period. However, there have been no negative type image-recording materials on which an image can be thermally recorded in direct platemaking from digital data from a computer, etc. with a solid-state or semiconductor laser emitting light having a wavelength in the near infrared to the infrared region (heat mode) and which have satisfactory recording properties.

SUMMARY OF THE INVENTION

Accordingly, an object of the present invention is to provide a negative type image-recording material on which an image can be recorded regardless of the wavelength of exposure light, in particular, to provide a negative type image-recording material on which an image can be recorded with near infrared (wavelength: 0.76 μm to 2.5 μm) to infrared light (wavelength: 0.76 μm to 1 mm), heat rays.

Another object of the present invention is to provide a negative type lithographic plate for direct platemaking by heat mode writing, on which plate an image can be directly formed from digital data sent from a computer, etc., using a solid-state or semiconductor laser emitting light having a wavelength in the near infrared to the infrared region (heat mode), and for which conventional processing apparatus and printing apparatus can be utilized as they are.

The above objects are accomplished with the following constitutions (1) and (2) according to the present invention.

(1) A negative type image-recording material containing both a substance which absorbs light and generates heat and a diazonium compound having two or more diazohio groups in the molecule.

(2) A negative type image-recording material which is a negative type lithographic plate for direct platemaking by heat mode writing, the lithographic plate comprising a support and formed on at least one surface of the support a layer containing a substance which absorbs infrared or near infrared light and generates heat and a layer containing a diazonium compound having two or more diazohio groups per molecule or a layer containing both a substance which absorbs infrared or near infrared light and generates heat and a diazonium compound having two or more diazohio groups in the molecule.

Preferred embodiments of the present invention include the following (3) to (16).

(3) A negative type image-recording material comprising a support and formed thereon a layer containing both a substance which absorbs infrared or near infrared light and generates heat and a diazonium compound having two or more diazonio groups per molecule.

(4) A negative type image-recording material comprising a support and formed thereon a layer containing a substance which absorbs infrared or near infrared light and generates heat, a diazonium compound having two or more diazonio groups per molecule, and a binder.

(5) The image-recording material as described in (4) above which contains a dye as the substance which absorbs infrared or near infrared light and generates heat.

(6) The image-recording material as described in (4) above which contains a pigment as the substance which absorbs infrared or near infrared light and generates heat.

(7) The image-recording material as described in (4) above which contains carbon black as the substance which absorbs infrared or near infrared light and generates heat.

(8) The image-recording material as described in (4) above which contains a diazo resin as the diazonium compound having two or more diazohio groups per molecule.

(9) The image-recording material as described in (4) above which contains an alkali-soluble resin as the binder.

(10) The image-recording material as described in (4) above which contains an acrylic resin as the binder.

(11) The image-recording material as described in (4) above which contains a polyurethane resin as the binder.

(12) The image-recording material as described in (4) above which contains an acetal-modified poly(vinyl alcohol) resin as the binder.

(13) The image-recording material as described in (4) above which contains a polyester film as the support.

(14) The image-recording material as described in (4) above which contains an aluminum sheet as the support.

(15) A negative type image-recording method which comprises exposing a negative type image-recording material to the infrared or near infrared light emitted by a laser and then developing the resulting image-recording material with an aqueous alkali solution, the negative type image-recording material comprising a support having thereon a substance which absorbs infrared or near infrared light and generates heat, a diazonium compound having two or more diazohio groups in the molecule, and a binder, which may be incorporated in the same layer or in different layers.

(16) The negative type image-recording material as described in (4) above which is a negative type heat-sensitive lithographic plate.

As a result of intensive studies made by the present inventors, it has been found that a negative type image-recording material on which recording is possible regardless of the wavelength of exposure light, in particular, with near infrared to infrared light, can be obtained by using a diazonium compound in combination with a substance which absorbs light and generates heat. The present invention has been achieved based on this finding. In the image-recording material of the present invention, the light energy resulting from exposure is converted to heat energy and the diazonium compound decomposes upon reception of the generated heat energy to record an image.

In the present invention, the diazonium compound having two or more diazohio groups per molecule means a low-molecular compound, an oligomer, or a polymer which each has two or more $-N_2^+$ groups.

The substance which absorbs light and generates heat, used in the present invention, is preferably a substance which absorbs infrared or near infrared light and generates heat, because this substance enables heat mode recording to be performed satisfactorily.

The negative type image-recording material of the present invention preferably contains a binder either in the layer containing the diazonium compound having two or more diazohio groups per molecule or in a layer adjacent to that layer, because this image-recording material shows improved printing performance when used as a lithographic plate.

In the present invention, the substance which absorbs infrared or near infrared light and generates heat is preferably a dye from the standpoint of developability after exposure, and is preferably a pigment from the standpoint of attaining higher sensitivity. The substance which absorbs infrared or near infrared light and generates heat also preferably is carbon black in that a wider absorption wavelength range and higher sensitivity are attained.

The diazonium compound having two or more diazonio groups per molecule, used in the present invention, is preferably a diazo resin, because this diazonium compound enables the film in the exposed areas to have a higher strength.

The binder which may be contained in the negative type image-recording material of the present invention is preferably an alkali-soluble resin, since the unexposed areas of the recording material containing an alkali-soluble resin binder are more easily removed in development with an aqueous alkaline developing solution after exposure. An acrylic resin is also preferred as the binder from the standpoint of developability. Moreover, a polyurethane resin and an acetal-modified poly(vinyl alcohol) resin are also preferred as the binder from the standpoint of printing durability.

The support for use in the present invention is preferably a polyester film because this support is lightweight. An aluminum sheet is also preferred as the support because of its high dimensional stability.

The negative type image-recording material of the present invention is preferably used in a negative type image-recording method in which the image-recording material is exposed to the infrared or near infrared light emitted by a laser, before being developed with an aqueous alkali solution.

The negative type image-recording material of the present invention is preferably a negative type heat-sensitive lithographic plate, in particular a negative type lithographic plate for direct platemaking by heat mode writing.

Heat mode writing is a technique of recording on an image-recording material using an appropriate heat ray source while controlling the heat ray source based on digital data. Examples of the heat ray source include thermal heads for facsimile, etc. and lasers which emit infrared or near infrared light. However, since use of thermal heads results in low resolving power, lasers emitting infrared or near infrared light are preferred for direct platemaking.

The image-recording material of the present invention basically is photosensitive because the light-heat converter substance converts light into heat and the diazonium compound decomposes upon reception of the generated heat. The preferred examples of the light for use in the present invention are ultraviolet rays, visible rays, and infrared rays. When recording is performed on the image-recording material of this invention with infrared rays, however, the image-recording material can be also regarded as heat-sensitive because infrared rays are also called heat rays.

DETAILED DESCRIPTION OF THE INVENTION

Various pigments or dyes can be used in the present invention as the substance which absorbs light and generates heat.

Examples of usable pigments include commercially available pigments and pigments described in Color Index (C.I.) Handbook, "Saishin Ganryo Binran (Handbook of the Newest Pigments)" (edited by Pigment Technology Society of Japan, 1977), "Saishin Ganryo Oyou Gijutsu (Newest Application Techniques for Pigments)" (CMC Shuppan, 1986), and "Insatsu Inki Gijutsu (Printing Ink Technology)" (CMC Shuppan, 1984).

Examples of pigment kinds include black pigments, yellow pigments, orange pigments, brown pigments, red pigments, purple pigments, blue pigments, green pigments, fluorescent pigments, and polymer-bonded pigments. Specific examples of usable pigments include insoluble azo pigments, azo lake pigments, condensed azo pigments, chelate azo pigments, phthalocyanine pigments, anthraquinone pigments, perylene and perylene pigments, thioindigo pigments, quinacridone pigments, dioxazine pigments, isoindolinone pigments, quinophthalone pigments, dyed lake pigments, azine pigments, nitroso pigments, nitro pigments, natural pigments, fluorescent pigments, inorganic pigments, and carbon black.

These pigments may be used either without any surface treatment or after undergoing a surface treatment. Examples of surface treatment methods include a technique of coating pigment surfaces with a resin or wax, a technique of adhering a surfactant to pigment surfaces, and a technique of bonding a reactive substance (e.g., a silane coupling agent, an epoxy compound, or a polyisocyanate) to pigment surfaces. These surface treatment techniques are described in "Kinzoku Sekken No Seishitsu To Oyou (Properties and Applications of Metal Soaps)" (Ko Shobo), "Insatsu Inki Gijutsu (Printing Ink Technology)" (CMC Shuppan, 1984), and "Saishin Ganryo Oyou Gijutsu (Newest Application Techniques for Pigments)" (CMC Shuppan, 1986).

The pigments have particle diameters of desirably from 0.01 to 10 μm, preferably from 0.05 to 1 μm. For dispersing the pigments, known dispersing techniques for use in ink production and toner production may be employed. Examples of dispersing machines include an ultrasonic dispersing apparatus, a sand mill, an attritor, a pearl mill, a super mill, a ball mill, an impeller, a disperser, a KD mill, a colloid mill, a dynatron, a three-roll mill, and a pressurized kneader. Such dispersing machines are described in detail in "Saishin Ganryo Oyou Gijutsu (Newest Application Techniques for Pigments)" (CMC Shuppan, 1986).

Examples of usable dyes include commercially available dyes and other known dyes described in the literature (e.g., "Senryo Binran (Handbook of Dyes)," edited by Organic Synthetic Chemistry Society (1970)). Specific examples of usable dyes include azo dyes, metal complex azo dyes, pyrazolone azo dyes, anthraquinone dyes, phthalocyanine dyes, carbonium dyes, quinoneimine dyes, methine dyes, and cyanine dyes.

Especially preferred of these pigments and dyes are those which absorb infrared or near infrared light.

Carbon black is preferably used as a pigment which absorbs infrared or near infrared light.

Examples of the dyes which absorb infrared or near infrared light include the cyanine dyes described, e.g., in JP-A-58-125246, JP-A-59-84356, JP-A-59-202829, and JP-A-60-78787; the methine dyes described, e.g., in JP-A-58-173696, JP-A-58-181690, and JP-A-58-194595; the naphthoquinone dyes described, e.g., in JP-A-58-112793, JP-A-58-224793, JP-A-59-48187, JP-A-59-73996, JP-A-60-52940, and JP-A-60-63744; the squarylium dyes described, e.g., in JP-A-58-112792; and the cyanine dyes described in British Patent 434,875.

The near infrared absorber described in U.S. Pat. No. 5,156,938 is also preferably used.

Especially preferred are the substituted arylbenzo(thio)pyrylium salt described in U.S. Pat. No. 3,881,924; the trimethinethiapyrylium salt described in JP-A-57-142645 (U.S. Pat. No. 4,327,169); the pyrylium compounds described in JP-A-58-181051, JP-A-58-220143, JP-A-59-41363, JP-A-59-84248, JP-A-59-84249, JP-A-59-146063, and JP-A-59-146061; the cyanine dye described in JP-A-59-216146; the pentamethinethiopyrylium salt described in U.S. Pat. No. 4,283,475; and the pyrylium compounds disclosed in JP-B-5-13514 and JP-B-5-19702.

Other examples of especially preferred dyes are the near-infrared-absorbing dyes represented by formulae (I) and (II) which are described in U.S. Pat. No. 4,756,993.

The conventional oil-soluble dyes hardly absorb infrared or near infrared light.

The pigment or dye may be incorporated into the image-recording material generally in an amount of from 0.01 to 50% by weight, desirably from 0.1 to 20% by weight, preferably from 0.5 to 15% by weight, based on the amount of all the solid contents of the image-recording material (i.e., the total amount of the remaining components on the support after dried). If the pigment or dye amount is smaller than 0.01% by weight, an image is not obtained. If the amount thereof is larger than 50% by weight, smearing occurs in the nonimage areas during printing.

The dye or pigment may be incorporated in the layer containing the diazonium compound or in a layer not containing the diazonium compound. In the latter case, it is desirable to incorporate the dye or pigment in a layer adjacent to the layer containing the diazonium compound.

The addition ratio by weight of the substance which absorbs light and generates heat to the diazonium compound is preferably from 1:25 to 25:1.

It is preferred that such a substance absorbs light and generates heat so that an exposed area of the image-recording material has a temperature of 150° C. or more.

Examples of the diazonium compound for use in the present invention, which has two or more diazonio groups per molecule, include conventionally known various diazonium compounds.

Such known diazonium compounds are described, for example, in JP-B-49-45323, JP-A-58-62641, JP-A-5-61191, U.S. Pat. Nos. 2,632,703, 3,174,860, 3,867,147, 4,215,041, 4,284,705, 4,595,648, and 4,902,601.

Preferred of such diazonium compounds from the standpoint of exposed-area film strength are diazo resins, i.e., polymers or oligomers which have diazonio groups in side chains.

Especially useful diazo resins are condensates of aromatic diazonium salts with, e.g., carbonylated active compounds (e.g., formaldehyde). Preferred examples of such diazo resins include those obtained by condensing a diazo monomer with a condensation agent in a molar ratio of from 1:1 to 1:0.5, desirably from 1:0.8 to 1:0.6, by an ordinary method and reacting the resulting condensate with an anion. Examples of the diazo monomer include 4-diazodiphenylamine, 1-diazo-4-N,N-dimethylaminobenzene, 1-diazo-4-N,N-diethylaminobenzene, 1-diazo-4-N-ethyl-N-hydroxyethylaminobenzene, 1-diazo-4-N-methyl-N-hydroxyethylaminobenzene, 1-diazo-2,5-diethoxy-4-benzoylaminobenzene, 1-diazo-4-N-benzylaminobenzene, 1-diazo-4-morpholinobenzene, 1-diazo-2,5-dimethoxy-4-p-tolymercaptobenzene, 1-diazo-2-ethoxy-4-N,N-dimethylaminobenzene, 1-diazo-2,5-dibutoxy-4-morpholinobenzene, 1-diazo-2,5-diethoxy-4-morpholinobenzene, 1-diazo-2,5-dimethoxy-4-morpholinobenzene, 1-diazo-2,5-diethoxy-4-p-tolylmercaptobenzene, 1-diazo-3-ethoxy-4-N-methyl-N-benzylaminobenzene, 1-diazo-3-chloro-4-N,N-diethylaminobenzene, 1-diazo-3-methyl-4-pyrrolidinobenzene, 1-diazo-2-chloro-4-N,N-dimethylamino-5-methoxybenzene, 1-diazo-3-methoxy-4-pyrrolidinobenzene, 3-methoxy-4-diazodiphenylamine, 3-ethoxy-4-diazodiphenylamine, 3-(n-propoxy)-4-diazodiphenylamine, and 3-isopropoxy-4-diazodiphenylamine. Examples of the condensation agent include formaldehyde, acetaldehyde, propionaldehyde, butyraldehyde, isobutyraldehyde, and benzaldehyde. Examples of the anion include tetrafluoroboric acid, hexafluorophosphoric acid, triisopropylnaphthalenesulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, di-t-butylnaphthalenesulfonic acid, 1-naphthol-5-sulfonic acid, 2-methoxy-4-hydroxy-5-benzoylbenzenesulfonic acid, and p-toluenesulfonic acid. Especially preferred of these are hexafluorophosphoric acid, triisopropylnaphthalenesulfonic acid, and alkylated aromatic sulfonic acids such as 2,5-dimethylbenzenesulfonic acid.

Also preferably used in the present invention are a diazo resin obtained by condensing a diazo monomer such as those enumerated above with an aldehyde having a carboxylic acid and/or a phenol or with an acetal thereof (optionally further with a condensation agent such as those enumerated above) and reacting the resulting condensate with an anion such as those enumerated above; and the diazo resin described in JP-A-1-102456 and JP-A-1-102457. In particular, diazo resins having carboxy groups are especially preferred in that this kind of diazo resins bring about improved developability and this results in reduced smearing in the nonimage areas during printing.

The most desirable of the aforementioned diazo resins are those which contain structural units represented by the following general formula (1) or contain both structural units represented by the general formula (1) and structural units represented by the following general formula (2) and which have a weight-average molecular weight of 500 or higher, desirably 800 or higher, preferably 1,000 or higher, with the preferred upper limit being 100,000. This is because such diazo resins not only have good decomposability with heat generated upon exposure but also impart good storage stability to the image-recording material. If the weight-average molecular weight thereof is below 500, the film in the image areas has a reduced strength. The proportion of the structural units represented by formula (1) to those represented by formula (2) is desirably from 100:0 to 30:70 by weight. If the amount of the structural units represented by formula (1) is too small, the film in the image areas has a reduced strength. The diazo resins may contain other structural units.

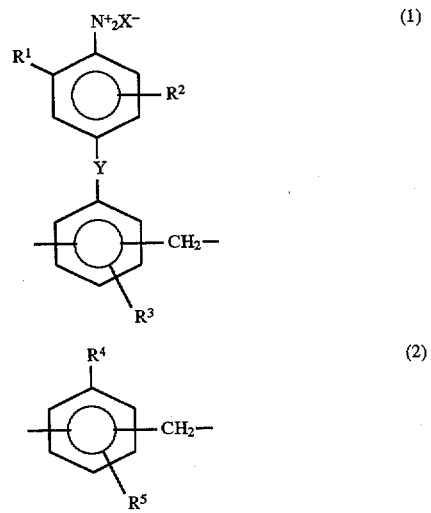

In formulae (1) and (2), $R^1$, $R^2$, $R^3$, $R^4$, and $R^5$ each represents a hydrogen atom, a halogen atom (e.g., fluorine, chlorine or bromine), —COOH, —OPO$_3$H$_2$, —PO$_3$H$_2$, —SO$_3$H, —OH, a hydrocarbon group having up to 15 carbon atoms and optionally substituted with a substituent (e.g., —COOH, —OPO$_3$H$_2$, —PO$_3$H$_2$, —SO$_3$H or —OH) such as carboxymethyl, hydroxyethyl or p-carboxymethoxyphenyl, an alkoxy group having up to 15 carbon atoms such as methoxy, hexyloxy or carboxymethoxy or an aryloxy group having up to 15 carbon atoms such as phenoxy or p-carboxymethoxyphenoxy; and Y represents NR$^6$, O or S, wherein R$^6$ represents a hydrogen atom or a hydrocarbon group having up to 12 carbon atoms such as methyl, ethyl or hexyl.

Further, X$^-$ represents PF$_6^-$ or benzenesulfonate or naphthalenesulfonate both of which may have a substituent having up to 20 carbon atoms. Examples of the substituent include methyl, butyl (including n-, iso-, sec-, and t-butyl groups), hexyl, decyl, dodecyl, and benzoyl.

The content of such a diazonium compound in the image-recording material is generally from 1 to 50% by weight, desirably from 3 to 35% by weight, preferably from 5 to 25% by weight based on the amount of all the solid contents of the image-recording material. If the diazonium compound content is lower than 1% by weight, an image is not obtained. If the content thereof is higher than 50% by weight, smearing is apt to occur in the nonimage areas during printing. Two or more diazonium compounds may be used in combination, if desired. The use of two or more diazonium compounds in combination enables easier sensitivity control.

The negative type image-recording material of the present invention, which contains a substance absorbing light and generating heat and a diazonium compound having two or more diazonio groups per molecule, desirably further contains a binder so as to have improved printing performance when used as a lithographic plate.

The ratio by weight of the substance which absorbs light and generates heat and a binder in the layer containing the substance which absorbs light and generates heat is generally 0.01 to 50:100, preferably from 0.1 to 20:100, more preferably from 0.5 to 15:100. The ratio by weight of the diazonium compound to a binder in the layer containing the diazonium compound is generally from 1 to 50:100, preferably from 3 to 35:100, more preferably from 5 to 25:100.

Examples of the binder for use in the present invention include conventionally known various polymers.

Such known polymers are described, for example, in JP-B-51-10121, JP-B-52-7364, JP-B-52-34933, JP-B-54-3607, jP-B-54-3608, JP-B-54-19773, JP-B-55-34929, JP-B-57-43890, JP-B-59-47675, JP-B-57-46772, JP-B-59-42862, JP-B-59-17730, JP-B-60-48021, JP-A-50-17827, JP-A-50-54405, JP-A-50-112101, JP-A-51-143318, JP-A-52-110102, JP-A-52-110103, JP-A-53-33116, JP-A-53-106203, JP-A-54-65027, JP-A-54-88403, JP-A-54-117202, JP-A-54-156522, JP-A-55-22791, JP-A-56-4144, JP-A-56-94346, JP-A-57-94747, JP-A-58-2830, JP-A-58-27141, JP-A-58-49940, JP-A-58-115434, JP-A-58-137834, JP-A-58-199342, JP-A-59-10946, JP-A-59-12432, JP-A-59-136731, JP-A-59-154443, JP-A-60-70440, JP-A-60-182437, JP-A-60-186837, JP-A-60-212758, JP-A-60-217356, and U.S. Pat. Nos. 3,847,614, 3,869,292, and 4,154,614.

After exposure, the image-recording material of the present invention is developed with an aqueous developing solution, preferably an aqueous alkaline developing solution. Hence, the binder is preferably an alkali-soluble polymer. In the case of making a polymer alkali-soluble, this may be achieved by incorporating acid group(s) having a $pK_a$ of 14 or lower into the main chain or side chains of the polymer. Examples of such an acid group include —SO$_3$H, —OP(O)(OH)$_2$, —P(O)(OH)$_2$, —COOH, —CONHCO—, —CONHSO$_2$—, —SO$_2$NH—, and phenolic OH.

Alkali-soluble polymers preferably used in the present invention include the acrylic resins, polyurethane resins, and acetal-modified poly(vinyl alcohol) resins enumerated below.

Desirable acrylic resins are polymers each obtained by polymerizing at least one radical-polymerizable monomer selected from the following group A with at least one radical-polymerizable monomer selected from the following group B and at least one radical-polymerizable monomer selected from the following group C.

Group A: Monomers containing at least one of the acid groups enumerated above and further containing a radical-polymerizable ethylenic double bond. Examples of thereof include acrylic acid, methacrylic acid, itaconic acid, and the following compounds.

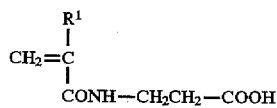

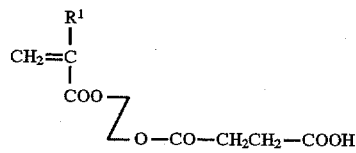

-continued

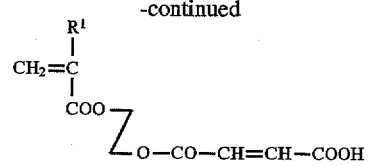

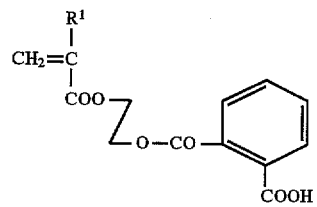

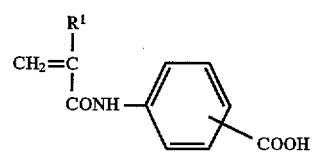

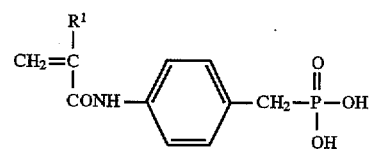

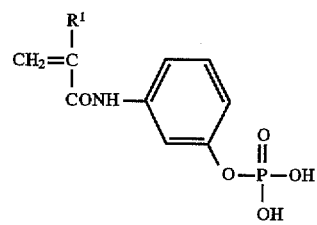

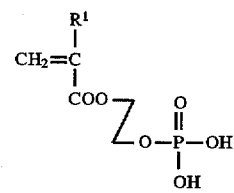

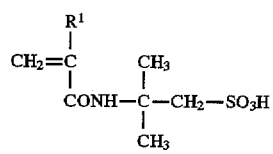

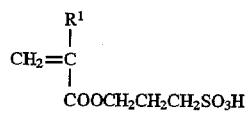

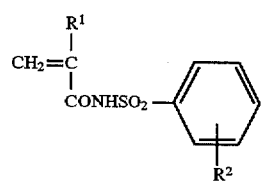

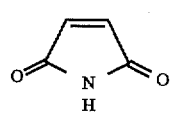

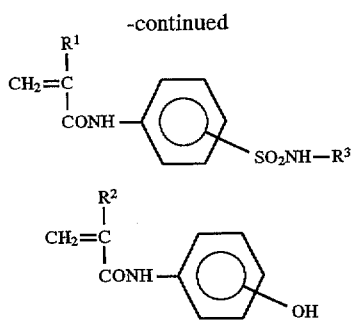

In the above formulae, $R^1$ and $R^2$ each represents H (a hydrogen atom) or a methyl group, and $R^3$ represents H or a hydrocarbon group having up to 12 carbon atoms and optionally substituted with a substituent(s) (e.g., a halogen, methoxy, hydroxyl, or cyano) such as methyl, ethyl, isopropyl, t-butyl, phenyl, tolyl, naphthyl, chlorophenyl or cyanophenyl).

Group B: Monomers containing an ethylenyic double bond radical-polymerizable with a hydroxyl or cyano group. Examples thereof include 2-hydroxyethyl (meth)acrylate, 2- or 3-hydroxypropyl (meth)acrylate, 4-hydroxybutyl (meth) acrylate, 5-hydroxypentyl (meth)acrylate, 2-hydroxyethyl (meth)acrylamide, o-, m-, or p-hydroxyphenyl(meth) acrylamide, acrylonitrile, methacrylonitrile, o-, m-, or p-cyanophenyl (meth)acrylate, and o-, m-, or p-cyanophenyl (meth)acrylamide.

Group C: (Meth)acrylates and (meth)acrylamides which each has an optionally substituted hydrocarbon group having up to 12 carbon atoms and styrene which may be substituted.

Examples thereof include alkyl (meth)acrylates and (meth)acrylamides which each has up to 15 carbon atoms in total, phenyl (meth)acrylate, benzyl (meth)acrylate, allyl (meth)acrylate, and styrene.

Preferred acrylic resins further include the graft polymers described in JP-A-1-302345, JP-A-2-230151, JP-A-5-27424, and JP-A-5-80508 and the block polymer described in JP-A-5-100419.

Examples of polyurethane resins include those described in JP-A-62-123452, JP-A-62-123453, JP-A-62-175734, JP-A-63-113450, JP-A-63-261350, JP-A-63-287942, JP-A-63-287943, JP-A-63-287944, JP-A-63-287946, JP-A-1-223445, JP-A-1-271741, JP-A-2-24656, JP-A-2-77748, JP-A-2-146042, and JP-A-5-281718.

Especially preferred polyurethane resins are those obtained by the polyaddition of a diisocyanate compound with a diol compound having carboxyl group(s) and, if desired, further with other diol compounds.

Also preferred are the graft polymer described in EP 406,600A1 and the block polymer described in JP-A-5-142765.

Preferred examples of acetal-modified poly(vinyl alcohol) resins include those described in JP-A-61-267042, JP-A-61-281236, JP-A-62-58242, JP-A-62-169154, and JP-A-62-175732.

These binders have a weight-average molecular weight of 2,500 or higher, desirably from 5,000 to 300,000, preferably from 10,000 to 250,000. If the weight-average molecular weight thereof is lower than 2,500, the image-area film has a reduced strength. If the weight-average molecular weight thereof is too high, developability is apt to deteriorate. The number-average molecular weights of the binders are 1,500 or higher, desirably from 2,000 to 250,000, preferably from 5,000 to 200,000. The polydispersity coefficients (weight-average molecular weight/number-average molecular weight) thereof are desirably from 1 to 20, preferably from 1 to 15, especially preferably from 1 to 10. Too high polydispersity coefficients result in impaired developability. Polydispersity coefficient never decreases to below 1 because of its definition.

The binder may be used either alone or in combination of two or more thereof. The content of the binder in the image-recording material is generally about from 5 to 95% by weight, preferably about from 10 to 90% by weight, more preferably from 30 to 90% by weight. Too low binder contents result in a reduced strength of the image-area film.

Various additives may be added to the image-recording material of the present invention, if desired.

For example, a polyfunctional monomer having two or more radical-polymerizable ethylenic double bonds in the molecule may be added. Examples of this compound include ethylene glycol di(meth)acrylate, diethylene glycol di(meth) acrylate, polyethylene glycol di(meth)acrylate, hexanediol di(meth)acrylate, trimethylolethane tri(meth)acrylate, trimethylolpropane tri(meth)acrylate, and tri-, tetra-, or hexa (meth)acrylates of pentaerythritol and dipentaerythritol. These polyfunctional monomers may be added in an amount up to 30% by weight based on the amount of all the solid contents of the image-recording material.

A stabilizer for the diazonium compound may be added. Examples of the stabilizer include phosphoric acid, p-hosphorous acid, pyrophosphoric acid, oxalic acid, boric acid, p-toluenesulfonic acid, benzenesulfonic acid, p-hydroxybenzenesulfonic acid, 2-methoxy-4-hydroxy-5-benzoylbenzenesulfonic acid, malic acid, tartaric acid, dipicolinic acid, poly(acrylic acid) and acrylic acid copolymers, poly(vinylphosphonic acid) and vinylphosphonic acid copolymers, poly(vinylsulfonic acid) and vinylsulfonic acid copolymers, 5-nitronaphthalene-1-phosphonic acid, 4-chlorophenoxymethylphosphonic acid, sodium phenylmethylpyrazolonesulfonate, 2-phosphonobutane-1,2, 4-tricarboxylicacid, 1-phosphonoethane-1,2,2-tricarboxylicacid, and 1-hydroxyethane-1,1-disulfonic acid.

For the purpose of improving applicability, alkyl ethers (e.g., ethyl cellulose and methyl cellulose) and surfactants (e.g., fluorine-compound surfactants) may be added. In order to impart flexibility and wear resistance to the film, plasticizers may be added (e.g., tricresyl phosphate, dimethyl phthalate, dibutyl phthalate, trioctyl phosphate, tributyl phosphate, tributyl citrate, polyethylene glycol, and polypropylene glycol). The addition amount of these additives vary depending on the intended purposes thereof, but it is generally from 0.5 to 30% by weight based on the amount of all the solid contents of the image-recording material.

A printing-out agent may be used for obtaining a visible image immediately after heat generation resulting from exposure. Representative examples of the printing-out agent include combinations of a compound which releases an acid upon reception of the heat generated by exposure and an organic dye capable of forming a salt therewith. Specific examples thereof include the combinations of an o-naphthoquinonediazide-4-sulfonyl halogenide and a salt-forming organic dye as described in JP-A-50-36209 and JP-A-53-8128 and the combinations of a trihalomethyl compound and a salt-forming organic dye as described in JP-A-53-36223 and JP-A-54-74728. Dyes other than such salt-forming organic dyes may also be used for coloring an image. Preferred examples of the dye includes, as well as the salt-forming organic dye, an oil-soluble dye and a basic dye.

Specific examples thereof include Oil Yellow #101, Oil Yellow #130, Oil Pink #312, Oil Green BG, Oil Blue BOS, Oil Blue #603, Oil Black BY, Oil Black BS, Oil Black T-505 (all manufactured by Orient Chemical industries, Ltd., Japan), Victoria Pure Blue, Crystal Violet (CI 42555), Methyl Violet (CI 42535), Rhodamine B (CI 45170B), Malachite Green (CI 42000), and Methylene Blue (CI 52015).

These printing-out agents and dyes may be added in an amount of from 0 to 30% by weight based on the amount of all the solid contents of the image-recording material.

In the case where a visible image having a sufficient density is obtained due to the substance of the invention which absorbs light and generates heat, there is no need of adding such a dye.

The image-recording material of the present invention is applied to a support using a solvent for dissolving or dispersing the above-described ingredients therein. Examples of the solvent include methanol, ethanol, isopropyl alcohol, n-butyl alcohol, t-butyl alcohol, ethylene dichloride, cyclohexanone, acetone, methyl ethyl ketone, ethylene glycol, ethylene glycol monomethyl ether, ethylene glycol monoethyl ether, 2-methoxyethyl acetate, 1-methoxy-2-propanol, 1-methoxy-2-propyl acetate, N,N-dimethylformamide, tetrahydrofuran, dioxane, dimethyl sulfoxide, ethyl acetate, methyl lactate, and ethyl lactate. These solvents may be used alone or in admixture.

A mixed solvent prepared by mixing the above-mentioned solvent, which may be a mixture of two or more thereof, with a small amount of a solvent in which diazo resins or polymers are insoluble, e.g., water or toluene, is also advantageously used.

The total concentration (in terms of solid content) of the above-described ingredients in the coating liquid is generally from 1 to 50% by weight.

The coating liquid prepared by dissolving or dispersing the above-described ingredients into such a solvent is applied, and then dried desirably at 50° C. to 120° C. The applied coating liquid may be first predried at a lower temperature and then dried at a higher temperature. By selecting a suitable solvent and concentration, the coating liquid may be formulated so as to be directly dried at a high temperature.

Application amounts vary depending on uses. However, in the case of a photosensitive lithographic plate (heat-sensitive lithographic plate), for example, the coating liquid is preferably applied in an amount of generally from 0.5 to 3.0 g/m$^2$ on a solid basis. Smaller application amounts result in a photosensitive film having higher photosensitivity but reduced physical properties. If desired and necessary, a matte or a matte layer may be formed on the photosensitive film.

The support for use in the present invention generally has a thickness of 0.1 to 0.5 mm.

Examples of the support on which the image-recording material of the present invention is applied include paper; papers laminated with plastics (e.g., polyethylene, polypropylene, and polystyrene); sheets of metals such as, e.g., aluminum (including aluminum alloys), zinc, and copper; films of plastics such as, e.g., cellulose diacetate, cellulose triacetate, cellulose propionate, cellulose acetate, cellulose acetate butyrate, cellulose butyrate, poly(ethylene terephthalate), polyethylene, polystyrene, polypropylene, polycarbonates, and poly(vinyl acetal)s; and papers or plastic films which have a laminated or vapor-deposited layer of a metal of the aforementioned kind. Of these supports, use of a polyester film or an aluminum sheet is preferred. In particular, an aluminum sheet is especially preferred because of its exceedingly high dimensional stability. Also preferred is a composite sheet comprising a poly(ethylene terephthalate) film and an aluminum sheet bonded thereto, such as the composite sheet described in JP-B-48-18327.

In the case of a support having a metallic surface, in particular having an aluminum surface, it is desirable to perform an appropriate hydrophilizing treatment.

In a preferred hydrophilizing treatment, the support surface made of, e.g., aluminum is first grained by mechanical graining, such as wire brush graining, brush graining in which the surface is roughened with a nylon brush while pouring a slurry of abrasive particles thereonto, or ball graining, by chemical graining using HF, AlCl$_3$, or HCl as an etchant, by electrolytic graining using nitric acid or hydrochloric acid as an electrolyte, or by a combination of two or more of these surface-toughening techniques, and the grained aluminum surface is optionally etched with an acid or alkali and is then anodized in sulfuric acid, phosphoric acid, oxalic acid, boric acid, chromic acid, sulfamic acid, or a mixture thereof using a direct-current or alternating-current source to form a passive-state film tenaciously adherent to the aluminum surface. The aluminum surface is hydrophilized by the presence of such a passive-state film only. However, an especially preferred support is obtained by further hydrophilized the resulting aluminum surface by any of various additional hydrophilizing treatments according to need. Examples of such additional hydrophilizing treatments include the treatment with a silicic acid salt (sodium silicate or potassium silicate) as described in U.S. Pat. Nos. 2,714,066 and 3,181,461; the treatment with potassium fluorozirconate as described in U.S. Pat. No. 2,946,638; the phosphomolybdate treatment described in U.S. Pat. No. 3,201,247; the treatment with an alkyl titanate as described in British Patent 1,108,559; the poly(acrylic acid) treatment described in German Patent 1,091,433; the poly(vinylphosphonic acid) treatment described in German Patent 1,134,093 and British Patent 1,230,447; the treatment with a phosphonic acid as described in JP-B-44-6409; the treatment with phytic acid as described in U.S. Pat. No. 3,307,951; the complex treatment with a combination of a hydrophilic organic polymer and a divalent metal as described in JP-A-58-16893 and JP-A-58-18291; and the priming treatment with a water-soluble polymer having sulfonic acid group as described in JP-A-59-101651. Other methods for hydrophilizing treatment include the electrodeposition of a silicate as described in U.S. Pat. No. 3,658,662.

Examples of the source of actinic rays for use in image-wise exposure include a mercury lamp, a metal halide lamp, a xenon lamp, a chemical lamp, and a carbon arc lamp. Examples of radiations include electron rays, X-rays, ion beams, and far infrared rays. Also usable are g-line, i-line, deep-UV light, and high-density energy beams (laser beams). Examples of the laser beams include helium-neon laser beam, argon laser beam, krypton laser beam, helium-cadmium laser beam, and KrF excimer laser beam. In the present invention, light sources which emit light having a wavelength in the near infrared to the infrared region are preferred. In particular, solid-state lasers and semiconductor lasers are especially preferred.

The developing solution and replenishing solution for the negative type image-recording material of the present invention each may be a conventionally known aqueous alkali solution. Examples of the alkali include inorganic alkali salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, ammonium hydroxide, potassium hydroxide, and lithium hydroxide; and organic alkalis such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine. The alkali may be used alone or in combination of two or more thereof.

It is preferred that the developing solution has a pH of 9 to 13.5.

Into the developing solution and replenishing solution, various surfactants and organic solvents may be incorporated if desired, for the purposes of accelerating or retarding development, dispersing a development scum, and enhancing the affinity for ink of the image areas of the printing plate. Preferred surfactants include anionic, cationic, nonionic, and ampholytic surfactants.

If desired, a reducing agent, e.g., hydroquinone, resorcinol, a salt of an inorganic acid such as sulfurous acid or hydrogensulfurous acid with sodium, potassium, etc., may be also added to the developing solution and replenishing solution. Furthermore, an organic carboxylic acid, an antifoaming agent, and a water softener may also be optionally added.

Especially preferred of such developing solutions are, for example, those described in JP-A-54-62004 and JP-B-57-7427; the developing solution composition disclosed in JP-A-51-77401, which comprises benzyl alcohol, an anionic surfactant, an alkali, and water; the developing solution composition described in JP-A-53-44202, which is an aqueous solution containing benzyl alcohol, an anionic surfactant, and a water-soluble salt of sulfurous acid; and the developing solution composition described in JP-A-55-155355, which comprises water, an alkali, and an organic solvent having a solubility in water at ordinary temperature of 10 wt % or lower.

In the case where the image-recording material of the present invention is used as a printing plate, the image-recording material which has been processed using the developing solution and replenishing solution described above is preferably subjected to post-treatments with washing water, a rinsing liquid containing a surfactant, etc., and a desensitizing solution containing gum arabic or a starch derivative. These post-treatments may be performed in any combination.

In recent years, an automatic processor for printing plates is widely employed in the platemaking and printing industries for the purpose of the rationalization and standardization of platemaking operation. This automatic processor generally comprises a development part, a post-treatment part, a means for conveying printing plates, processing solution tanks, and spraying devices. In this automatic processor, the treating solutions each is pumped up and sprayed over an exposed printing plate, while the printing plate is kept horizontal and continuously conveyed, to thereby process the printing plate. A system in which a printing plate is processed by conveying the same while immersing it in tanks filled with treating solutions by means of guide rolls disposed in the treating solutions is also known recently. In such automatic processing, it is possible to process printing plates while replenishing the treating solutions in respective amounts corresponding to processing amount, operation period, etc.

The so-called throwaway processing system in which printing plates are processed with substantially fresh processing solutions is also usable.

If the lithographic plate obtained by image-wise exposing the photosensitive lithographic plate of the present invention and developing the resulting plate, followed by water washing and/or rinsing and/or gum coating has an unnecessary image area (e.g., a mark of an edge of the original film), this unnecessary image area is deleted. This deletion may be achieved, for example, by a method comprising applying a deletion liquid, such as that described in JP-B-2-13293, to the unnecessary image are, and allowing this area to stand for a given time period, followed by washing with water.

The lithographic plate thus obtained may be coated with a desensitizing gum if desired and necessary, before being subjected to printing operation.

The present invention will be explained below in more detail by reference to the following Examples, but the invention should not be construed as being limited thereto.

EXAMPLE 1

Production of Substrate

A substrate was produced as follows according to the method disclosed in JP-A-56-28893. The surface of an aluminum sheet having a thickness of 0.24 mm was grained with a nylon brush and an aqueous suspension of a 400-mesh pumice, and then sufficiently washed with water. The grained aluminum sheet was etched by immersion in 10% aqueous sodium hydroxide solution at 70° C. for 60 seconds, washed with running water, subsequently neutralized and cleaned with 20% $HNO_3$, and washed with water. This aluminum sheet was then subjected to electrolytic surface-toughening treatment in 1% aqueous nitric acid solution using a sine-wave alternating current under conditions of an anode-time voltage of 12.7 V and a quantity of electricity of 160 $C/dm^2$ at the time of anode, with the ratio of the cathode-time quantity of electricity to the anode-type quantity of electricity being 0.8. The roughness of the roughened surface was measured and found to be 0.6 μm (in terms of $R_a$). The resulting aluminum sheet was subsequently immersed in 30% aqueous sulfuric acid solution to desmut the surface at 55° C. for 2 minutes and then anodized in 20% aqueous sulfuric acid solution at a current density of 2 $A/dm^2$ to such a degree that an oxide film was formed at a thickness of 2.7 $g/m^2$. This aluminum sheet was thereafter immersed in a 2.5% aqueous sodium silicate solution at 70° C. for 1 minute, washed with water, and then dried.

Production of Carbon Black Dispersion

A mixture having the following composition was treated with glass beads for 10 minutes to disperse the carbon black. Thus, a carbon black dispersion was obtained.

| | |
|---|---|
| Carbon black | 1 part by weight |
| Copolymer of benzyl methacrylate and methacrylic acid (72:28 by mol; weight-average molecular weight, 70,000) | 1.6 parts by weight |
| Cyclohexanone | 1.6 parts by weight |
| Methoxypropyl acetate | 3.8 parts by weight |

Production of Negative Type Photosensitive Lithographic Plate

The aluminum sheet obtained above was coated with the photosensitive liquid described below, and the coating was dried at 100° C. for 2 minutes to obtain a negative type photosensitive lithographic plate. The weight of the photosensitive coating after drying was 2.0 g/m².

| Photosensitive Liquid: | |
| --- | --- |
| Carbon black dispersion prepared above | 10 g |
| Hexafluorophosphoric acid salt of 4-diazodiphenylamine/formaldehyde condensate | 0.5 g |
| Radical copolymer of methacrylic acid, 2-hydroxyethyl acrylate, benzyl methacrylate, and acrylonitrile (15:30:40:15 by mol; weight-average molecular weight, 100,000) | 5 g |
| Malic acid | 0.05 g |
| FC-430 (fluorine-compound surfactant manufactured by Minnesota Mining and Manufacturing Company) | 0.05 g |
| 1-Methoxy-2-propanol | 80 g |
| Ethyl lactate | 15 g |
| Water | 5 g |

The negative type photosensitive lithographic plate obtained was exposed with a YAG laser regulated to have a plate-surface output of 2 W, and then processed in an automatic processor containing developing solution DN-3C (1:1) and gum solution FN-2 (1:1), both manufactured by Fuji Photo Film Co., Ltd. As a result, a negative image was obtained. This lithographic plate was used to conduct printing using printing press SOR-KZ manufactured by Heidelberger Druckmaschinen Aktiengesellschaft. As a result, about 40,000 prints of satisfactory quality were obtained.

Comparative Example 1

A negative type photosensitive lithographic plate was produced in the same manner as in Example 1, except that 0.3 g of an oil-soluble dye (Victoria Pure Blue BOH) was used in place of the carbon black dispersion in the photosensitive composition used in Example 1. This photosensitive lithographic plate was exposed and processed in the same manner as in Example 1. As a result, the photosensitive film had entirely dissolved in the developing solution, so that no image was obtained.

EXAMPLE 2

The aluminum sheet used in Example 1 was coated with the following photosensitive liquid, and the coating was dried at 100° C. for 2 minutes to obtain a negative type photosensitive lithographic plate. The weight of the photosensitive coating after drying was 2.0 g/m².

| Photosensitive Liquid: | |
| --- | --- |
| Carbon black dispersion prepared above | 3 g |
| n-Dodecylbenzenesulfonic acid salt of 4-diazodiphenylamine/formaldehyde condensate | 0.5 g |
| Polyurethane synthesized from diphenylmethane diisocyanate, hexamethylene diisocyanate, 2,2-bis(hydroxymethyl)propionic acid, and 1,4-butanediol (25:25:40:10 by mol; weight-average molecular weight, 80,000) | 5 g |
| Oil-soluble dye (Victoria Pure Blue BOH) | 0.2 g |
| Malic acid | 0.05 g |
| FC-430 (fluorine-compound surfactant manufactured by Minnesota Mining and Manufacturing Company) | 0.05 g |
| 1-Methoxy-2-propanol | 100 g |

The negative type photosensitive lithographic plate obtained was exposed with a YAG laser regulated to have a plate-surface output of 2 W, and then processed in an automatic processor containing developing solution DN-3C (1:1) and gum solution FN-2 (1:1), both manufactured by Fuji Photo Film Co., Ltd. As a result, a negative image was obtained. This lithographic plate was used to conduct printing using printing press SOR-KZ. As a result, about 60,000 prints of satisfactory quality were obtained.

Comparative Example 2

A negative type photosensitive lithographic plate was produced in the same manner as in Example 2, except that the carbon black dispersion in the photosensitive composition used in Example 2 was omitted. This photosensitive lithographic plate was exposed and processed in the same manner as in Example 2. As a result, the photosensitive film had entirely dissolved in the developing solution, so that no image was obtained.

EXAMPLE 3

The aluminum sheet used in Example 1 was coated with the following photosensitive liquid, and the coating was dried at 100° C. for 2 minutes to obtain a negative type photosensitive lithographic plate. The weight of the photosensitive coating after drying was 2.0 g/m².

| Photosensitive Liquid: | |
| --- | --- |
| Carbon black dispersion prepared above | 4 g |
| n-Dodecylbenzenesulfonic acid salt of 4-diazodiphenylamine/formaldehyde condensate | 0.5 g |
| Acetal-modified poly(vinyl alcohol) resin having the following structure | 5 g |

$$\begin{array}{c}\text{+CH}_2\text{CHCH}_2\text{CH+}\quad\text{+CH}_2\text{CH+}\quad\text{+CH}_2\text{CH+}\quad\text{+CH}_2\text{CH+}\\|\qquad\qquad|\qquad\qquad|\qquad\qquad|\qquad\qquad|\\ O\qquad O\qquad\qquad OH\qquad OCO\qquad OCO\\ \diagdown CH\diagup\qquad\qquad\qquad\qquad\quad|\qquad\qquad|\\ |\qquad\qquad\qquad\qquad\qquad\qquad CH_2CH_2\quad CH_2CH_2\\ (n)C_3H_7\qquad\qquad\qquad\qquad\qquad|\qquad\qquad|\\ \qquad\qquad\qquad\qquad\qquad\qquad\qquad COOH\quad COOCH_2CH_2OH\end{array}$$

(50:10:30:10 by mol; weight-average molecular weight, 100,000)

| Malic acid | 0.05 g |
| --- | --- |
| FC-430 (fluorine-compound surfactant manufactured by Minnesota Mining and Manufacturing Company) | 0.05 g |
| 1-Methoxy-2-propanol | 100 g |

The negative type photosensitive lithographic plate obtained was exposed with a YAG laser regulated to have a plate-surface output of 2 W, and then processed in an automatic processor containing developing solution DN-3C (1:1) and gum solution FN-2 (1:1), both manufactured by Fuji Photo Film Co., Ltd. As a result, a negative image was obtained. This lithographic plate was used to conduct printing using printing press SOR-KZ. As a result, about 50,000 prints of satisfactory quality were obtained.

Comparative Example 3

A negative type photosensitive lithographic plate was produced in the same manner as in Example 3, except that 0.2 g of an oil-soluble dye (Victoria Pure Blue BOH) was used in place of the carbon black dispersion in the photosensitive composition used in Example 3. This photosensitive lithographic plate was exposed and processed in the same manner as in Example 3. As a result, the photosensitive film had entirely dissolved in the developing solution, so that no image was obtained.

EXAMPLE 4

The aluminum sheet used in Example 1 was coated with the following photosensitive liquid, and the coating was dried at 100° C. for 2 minutes to obtain a negative type photosensitive lithographic plate. The weight of the photosensitive coating after drying was 2.0 g/m².

| Photosensitive Liquid: | |
| --- | --- |
| Carbon black dispersion prepared above | 3 g |
| Di-t-butylnaphthalenesulfonic acid salt of 4-diazodiphenylamine/phenoxyacetic acid/formaldehyde condensate | 0.5 g |
| Radical copolymer of N-(p-sulfamoylphenyl)methacrylamide, 2-hydroxyethyl methacrylate, and allyl methacrylate (40:30:30 by mol; weight-average molecular weight, 50,000) | 5 g |
| Malic acid | 0.05 g |
| FC-430 (fluorine-compound surfactant manufactured by Minnesota Mining and Manufacturing Company) | 0.05 g |
| 1-Methoxy-2-propanol | 70 g |
| Methyl lactate | 30 g |

The negative type photosensitive lithographic plate obtained was exposed with a YAG laser regulated to have a plate-surface output of 2 W, and then processed with developing solution DP-4 (1:8), manufactured by Fuji Photo Film Co., Ltd. As a result, a negative image was obtained.

EXAMPLE 5

The aluminum sheet used in Example 1 was coated with the following photosensitive liquid, and the coating was dried at 100° C. for 2 minutes to obtain a negative type photosensitive lithographic plate. The weight of the photosensitive coating after drying was 2.0 g/m².

| Photosensitive Liquid: | |
| --- | --- |
| Carbon black dispersion prepared above | 3 g |
| Di-t-butylnaphthalenesulfonic acid salt of 4-diazodiphenylamine/phenoxyacetic acid/formaldehyde condensate | 0.5 g |
| Radical copolymer of N-(phenylsulfonyl)acrylaimide, p-hydroxyphenylmethacrylamide, and butyl acrylate (50:20:30 by mol; weight-average molecular weight, 60,000) | 5 g |
| Malic acid | 0.05 g |
| FC-430 (fluorine-compound surfactant manufactured by Minnesota Mining and Manufacturing Company) | 0.05 g |
| 1-Methoxy-2-propanol | 70 g |
| Methyl lactate | 30 g |

The negative type photosensitive lithographic plate obtained was exposed with a YAG laser regulated to have a plate-surface output of 2 W, and then processed with an aqueous solution containing sodium carbonate and sodium hydrogen carbonate. As a result, a negative image was obtained.

EXAMPLE 6

A negative type photosensitive lithographic plate was obtained in the same manner as in Example 1, except that the following dye was used in place of the carbon black dispersion used in Example 1.

| Dye: | |
| --- | --- |
| 2,6-Di-t-butyl-4-{5-(2,6-di-t-butyl-4H-thiopyran-4-ylidene)penta-1,3-dienyl}thiopyrylium tetrafluoroborate (disclosed in U.S. Pat. No. 4,283,475) | 0.02 g |

The negative type photosensitive lithographic plate obtained was exposed with a semiconductor laser (wavelength, 825 nm; spot diameter, $1/e^2$=11.9 µm) under conditions of a line speed of 8 m/sec and a plate-surface output of 110 mW. The resulting photosensitive plate was processed in the same manner as in Example 1. As a result, a thin line having a width of 10 µm was formed.

After the beam diameter was adjusted to 6 µm ($1/e^2$), the photosensitive lithographic plate was subjected to a halftone dot image exposure of 200 lpi at a resolution for writing of 4,000 dpi. The resulting plate was processed in the same manner to form a halftone dot image. The lithographic plate obtained was used to conduct printing on wood-free paper with a commercially available ink using printing press SOR-KZ. As a result, the lithographic plate showed excellent printing durability as in Example 1.

EXAMPLE 7

A negative type photosensitive lithographic plate was obtained in the same manner as in Example 2, except that the following dye was used in place of the carbon black dispersion used in Example 2.

| Dye: | |
| --- | --- |
| 2,6-Di-t-butyl-4-{5-(2,6-di-t-butyl-4H-thiopyran-4-ylidene)penta-1,3-dienyl}thiopyrylium tetrafluoroborate (disclosed in U.S. Pat. No. 4,283,475) | 0.02 g |

The negative type photosensitive lithographic plate obtained was exposed with a semiconductor laser (wavelength, 825 nm; spot diameter, $1/e^2$=11.9 µm) under conditions of a line speed of 8 m/sec and a plate-surface output of 110 mw. The resulting photosensitive plate was processed in the same manner as in Example 2. As a result, a thin line having a width of 10 µm was formed.

After the beam diameter was adjusted to 6 µm ($1/e^2$), the photosensitive lithographic plate was subjected to a halftone dot image exposure of 200 lpi at a resolution for writing of 4,000 dpi. The resulting plate was processed in the same manner to form a dot image. The lithographic plate obtained was used to conduct printing on wood-free paper with a commercially available ink using printing press SOR-KZ. As a result, the lithographic plate showed excellent printing durability as in Example 2.

According to the present invention, it is possible to obtain a negative type image-recording material on which an image can be recorded regardless of the wavelength of exposure light, in particular, a negative type image-recording material on which an image can be recorded with near infrared to infrared light (heat rays).

It is also possible according to the present invention to obtain a negative type lithographic plate for direct platemaking by heat mode writing, on which plate an image can be directly formed from digital data sent from a computer, etc., using a solid-state or semiconductor laser that emits light having a wavelength in the near infrared to the infrared region (heat mode), and for which conventional processing apparatus and printing apparatus can be utilized as they are.

While the invention has been described in detail and with reference to specific embodiments thereof, it will be apparent to one skilled in the art that various changes and modifications can be made therein without departing from the spirit and scope thereof.

What is claimed is:

1. A negative-working image-recording material which is developed with an aqueous alkaline developing solution and which comprises carbon black, a diazonium compound having two or more diazonio groups, and an acrylic resin obtained by polymerizing at least one radical-polymerizable Group A monomer with at least one radical-polymerizable Group B monomer and at least one radical-polymerizable Group C monomer, where the Group A monomer is selected from the group consisting of monomers containing a radical-polymerizable ethylenic double bond and at least one acid group selected from the group consisting of —$SO_3H$, —OP(O)(OH)$_2$, —P(O)(OH)$_2$, —COOH, —CONHCO—, —CONHSO$_2$—, —SO$_2$NH—, and phenolic —OH; the Group B monomer is selected from the group consisting of monomers containing an ethylenic double bond which is radical-polymerizable with a hydroxyl group or a cyano group; and the Group C monomer is selected from the group consisting of (meth)acrylates and (meth)acrylamides which each has an optionally substituted hydrocarbon group having up to 12 carbon atoms and styrene which may be substituted.

2. The negative-working image-recording material of claim 1, wherein said diazonium compound is a diazo resin.

3. A negative-working image-recording material which is developed with an aqueous alkaline developing solution and is a negative-working lithographic plate for direct platemaking by heat mode writing, said lithographic plate comprising a support having provided on at least one surface a layer containing carbon black, a layer containing a diazonium compound having two or more diazonio groups, and an acrylic resin obtained by polymerizing at least one radical-polymerizable Group A monomer with at least one radical-polymerizable Group B monomer and at least one radical-polymerizable Group C monomer, where the Group A monomer is selected from the group consisting of monomers containing a radical-polymerizable ethylenic double bond and at least one acid group selected from the group consisting of —$SO_3H$, —OP(O)(OH)$_2$, —P(O)(OH)$_2$, —COOH, —CONHCO—, —CONHSO$_2$—, —SO$_2$NH—, and phenolic —OH; the Group B monomer is selected from the group consisting of monomers containing an ethylenic double bond which is radical-polymerizable with a hydroxyl group or a cyano group; and the Group C monomer is selected from the group consisting of (meth)acrylates and (meth)acrylamides which each has an optionally substituted hydrocarbon group having up to 12 carbon atoms and styrene which may be substituted.

4. A negative-working image-recording material which is developed with an aqueous alkaline developing solution and is a negative-working lithographic plate for direct platemaking by heat mode writing, said lithographic plate comprising a support having provided on at least one surface a layer containing carbon black, a diazonium compound having two or more diazonio groups, and an acrylic resin obtained by polymerizing at least one radical-polymerizable Group A monomer with at least one radical-polymerizable Group B monomer and at least one radical-polymerizable Group C monomer, where the Group A monomer is selected from the group consisting of monomers containing a radical-polymerizable ethylenic double bond and at least one acid group selected from the group consisting of —$SO_3H$, —OP(O)(OH)$_2$, —P(O)(OH)$_2$, —COOH, —CONHCO—, —CONHSO$_2$—, —SO$_2$NH—, and phenolic —OH; the Group B monomer is selected from the group consisting of monomers containing an ethylenic double bond which is radical-polymerizable with a hydroxyl group or a cyano group; and the Group C monomer is selected from the group consisting of (meth)acrylates and (meth)acrylamides which each has an optionally substituted hydrocarbon group having up to 12 carbon atoms and styrene which may be substituted.

5. The negative-working image-recording material of claim 3, wherein said diazonium compound is a diazo resin.

6. The negative-working image-recording material of claim 4, wherein said diazonium compound is a diazo resin.

7. A negative working image-recording method which comprises exposing the negative working image-recording material of claim 1 to infrared or near infrared light emitted by a laser and then developing the resulting image-recording material with an aqueous alkali solution.

* * * * *